US009720029B2

(12) United States Patent
Sekigawa (10) Patent No.: US 9,720,029 B2
(45) Date of Patent: Aug. 1, 2017

(54) SEMICONDUCTOR DEVICE INCLUDING A SENSE ELEMENT AND A MAIN ELEMENT, AND CURRENT DETECTOR CIRCUIT USING THE SEMICONDUCTOR DEVICE

(71) Applicant: FUJI ELECTRIC CO., LTD., Kawasaki-shi (JP)

(72) Inventor: Kiyoshi Sekigawa, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 229 days.

(21) Appl. No.: 14/656,054

(22) Filed: Mar. 12, 2015

(65) Prior Publication Data

US 2015/0185275 A1    Jul. 2, 2015

Related U.S. Application Data

(63) Continuation of application No. PCT/JP2013/078941, filed on Oct. 25, 2013.

(30) Foreign Application Priority Data

Dec. 17, 2012  (JP) ................. 2012-274367

(51) Int. Cl.
*G01R 31/26* (2014.01)
*G01R 19/00* (2006.01)
(Continued)

(52) U.S. Cl.
CPC ..... *G01R 31/2608* (2013.01); *G01R 19/0092* (2013.01); *H03K 17/0828* (2013.01); *H03K 17/18* (2013.01); *H03K 2217/0027* (2013.01)

(58) Field of Classification Search
CPC ............ G01R 31/2608; G01R 19/0092; H03K 17/0828; H03K 17/18; H03K 2217/0027
(Continued)

(56) References Cited

U.S. PATENT DOCUMENTS 4,893,158 A    1/1990  Mihara et al.
5,621,601 A    4/1997  Fujihira et al.
(Continued)

FOREIGN PATENT DOCUMENTS

JP    64066970 A    3/1989
JP    07086587 A    3/1995
(Continued)

OTHER PUBLICATIONS

Internatioanl Search Report issued in PCT/JP2013/078941 dated Nov. 19, 2013. English translation provided.

*Primary Examiner* — Billy Lactaoen
(74) *Attorney, Agent, or Firm* — Rossi, Kimms & McDowell LLP (57) ABSTRACT

False detection relating to overcurrent is prevented, and it is determined with no dead time whether or not the current of a main element is an overcurrent. By a gate signal indicating conductivity being applied to the gate of a sense element earlier than to a main element when the main element is caused to be conductive, and overshoot caused by a differential circuit of the sense element gate input portion being caused before current flows into the main element, it is possible to prevent false detection relating to overcurrent, and determine with no dead time whether or not the current of the main element is an overcurrent.

7 Claims, 7 Drawing Sheets

(51) Int. Cl.
*H03K 17/082* (2006.01)
*H03K 17/18* (2006.01)

(58) Field of Classification Search
USPC .................................................. 324/762.01
See application file for complete search history.

(56) References Cited

U.S. PATENT DOCUMENTS

| | | | |
|---|---|---|---|
| 5,631,494 A * | 5/1997 | Sakurai | ............... H01L 27/0248 257/139 |
| 5,729,032 A | 3/1998 | Tomomatsu et al. | |
| 2005/0099751 A1 | 5/2005 | Kumagai | |
| 2008/0198526 A1 | 8/2008 | Hiyama | |
| 2012/0086424 A1 | 4/2012 | Uemura | |

FOREIGN PATENT DOCUMENTS

| | | | |
|---|---|---|---|
| JP | 07146722 A | | 6/1995 |
| JP | 07240516 A | | 9/1995 |
| JP | 10032476 A | | 2/1998 |
| JP | 2005151631 A | | 6/2005 |
| JP | 2008206348 A | | 9/2008 |
| JP | 2010246179 A | | 10/2010 |
| JP | 2012085407 A | | 4/2012 |

\* cited by examiner

SEMICONDUCTOR DEVICE INCLUDING A SENSE ELEMENT AND A MAIN ELEMENT, AND CURRENT DETECTOR CIRCUIT USING THE SEMICONDUCTOR DEVICE

CROSS-REFERENCE TO RELATED APPLICATIONS

This application is a continuation of International Application No. PCT/JP2013/078941, filed on Oct. 25, 2013, which is based on and claims priority to Japanese Patent Application No. JP 2012-274367, filed on Dec. 17, 2012. The disclosure of the Japanese priority application and the PCT application in their entirety, including the drawings, claims, and the specification thereof, are incorporated herein by reference.

BACKGROUND OF THE INVENTION

1. Field of the Invention

The present invention relates to a semiconductor device having a main element and a sense element for detecting current flowing through the main element, and to a current detector circuit in which the semiconductor device is used.

2. Related Art

Power semiconductor elements such as an IGBT (Insulated Gate Bipolar Transistor) or MOSFET (Metal-Oxide-Semiconductor Field-Effect Transistor) that supply current to a load are such that it is vital to detect current flowing through the power semiconductor element in order to carry out control for supplying an appropriate current to the load and an operation protecting against overcurrent.

Figure 4:
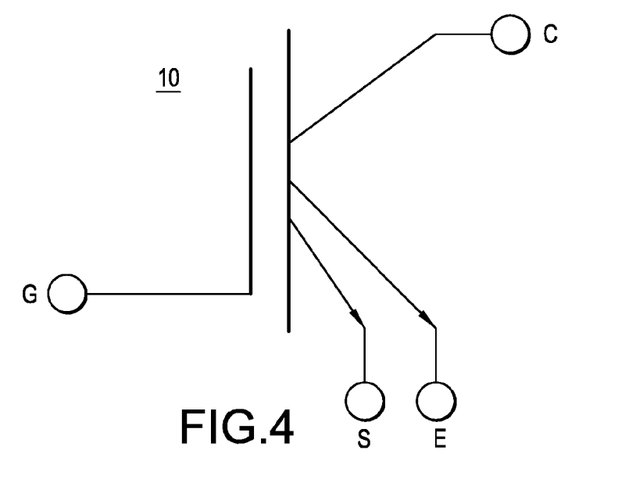
FIG. 4 is a symbol diagram of a composite element 10.

In order to do this, frequent use is made of a composite element having an emitter terminal E that supplies current to a load and a sense terminal S that causes current proportional to the current flowing through the emitter terminal to flow (FIG. 4 shows circuit symbols thereof). See, for example, Japanese Patent Application Publication Nos. JP-A-10-32476, JP-A-2010-246179 and JP-A-2012-85407. The composite element will be described with an IGBT as an example, and hereafter, in the same way, an IGBT will be given as an example of a power semiconductor element, but the invention, not being limited to an IGBT, is also applicable to other power semiconductor elements, such as a MOSFET.

Figure 5:
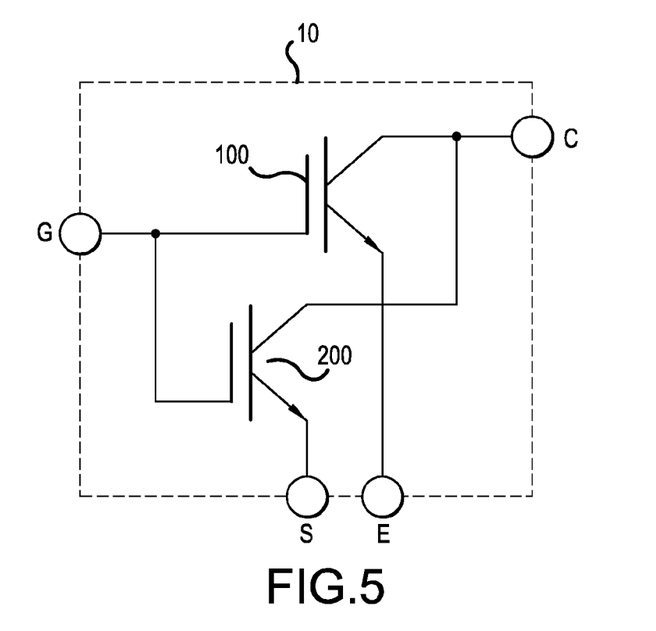
FIG. 5 is a diagram showing the configuration of the composite element 10.

A composite element 10 shown in FIG. 4 actually has the configuration shown in FIG. 5. That is, the composite element 10 is formed of a main element 100 and sense element 200, to both of which a collector terminal C and gate terminal G are connected. A sense terminal S corresponds to the emitter terminal of the sense element, and current that is 1/N (N<1) of current flowing through an emitter terminal E (of the main element) flows through the sense terminal S.

Figure 6:
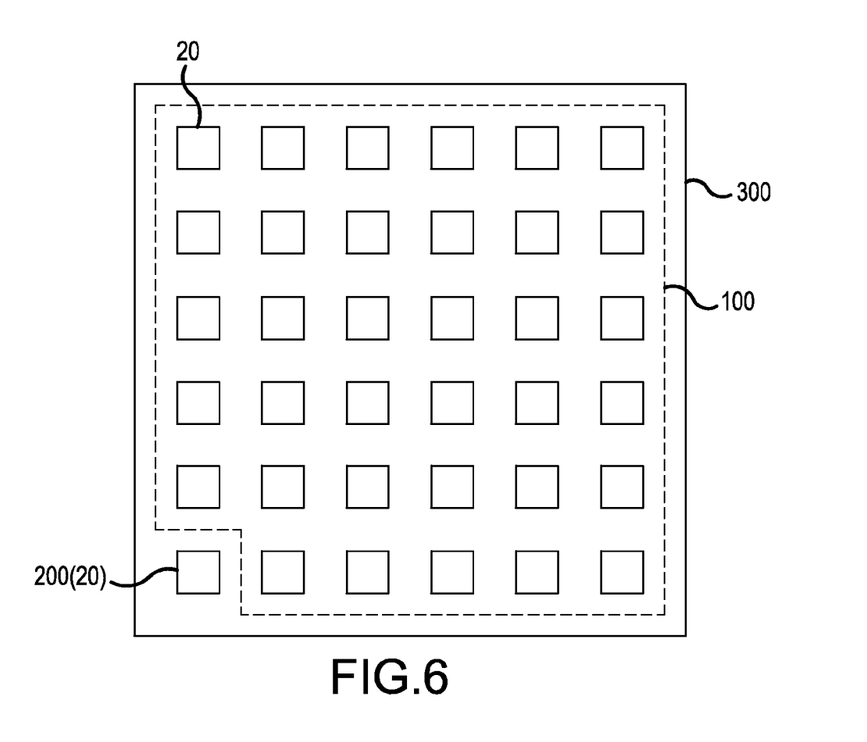
FIG. 6 is a diagram showing a configuration example of the composite element 10 on a semiconductor substrate.

A configuration example of the composite element 10 shown in FIGS. 4 and 5 on a semiconductor substrate 300 is shown in FIG. 6. In FIG. 6, unit elements 20 (IGBTs, MOSFETs, or the like, of a minimum size or a size near the minimum) are disposed regularly, one thereof configures the sense element 200, and the other N1 unit elements 20 configure the main element 100. The collector terminal, gate terminal, and source terminal of each of the unit elements 20 configuring the main element 100 are connected to each other by wiring not shown in the drawing. Also, as heretofore described, the gate terminals and collector terminals of the main element 100 and sense element 200 are also connected. Herein, N is basically equal to N1, but it may happen that the two are not of exactly the same value owing to the effect of the element ends.

Also, other than the configuration shown in FIG. 6, the configuration may be such that one large power semiconductor element is divided into two regions of differing sizes, the larger region is taken to be the main element 100 and the smaller region taken to be the sense element 200, and a gate terminal, source terminal, and collector terminal are provided in each thereof (the gate terminal and collector terminal are connected to each other).

Figure 7:
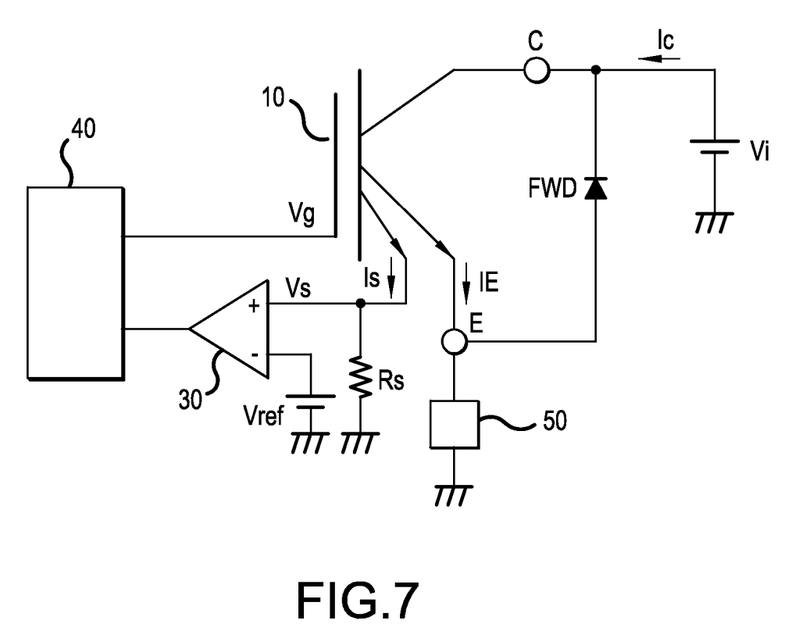
FIG. 7 is a diagram showing an example of a basic configuration of a circuit that carries out control and a protective action with respect to the composite element 10.

An example of a basic configuration of a circuit that carries out control and a protective action with respect to the composite element 10 is shown in FIG. 7. The circuit shown in FIG. 7 has the composite element 10, a resistor Rs (the resistance value thereof is also taken to be Rs), a reference voltage Vref, a comparator 30, and a control circuit 40. 50 is a load driven by the composite element 10. Current flowing through the sense terminal S is converted to a sense voltage Vs equal to Rs×Is by the resistor Rs, and the sense voltage Vs is input into a non-inverting input terminal of the comparator 30. Also, the reference voltage Vref is input into an inverting input terminal of the comparator 30. The comparator 30 carries out a comparison of the sense voltage Vs and reference voltage Vref, and transmits the result of the comparison to the control circuit 40. The control circuit 40 normally controls the turning on and off of the composite element 10 based on a command from the exterior, but when obtaining information from the comparator 30 that the sense voltage Vs is greater than the reference voltage Vref (when the output of the comparator 30 is a an H (High) level), the control circuit 40 determines that a current IE of the main element 100 proportional to a current Is is an overcurrent, and controls a gate voltage Vg of the composite element 10 so as to cause the composite element 10 to be turned off.

Also, FWD is a diode for causing a flow of current in a direction the reverse of that of current (forward current) flowing through the composite element 10. As the composite element 10 can cause only forward current to flow, the composite element 10 and diode FWD are used as a set in almost all applications. Also, a power supply Vi (the voltage thereof is also expressed as Vi) is connected to the collector terminal C of the composite element 10 and to the cathode of the diode FWD.

Figure 8:
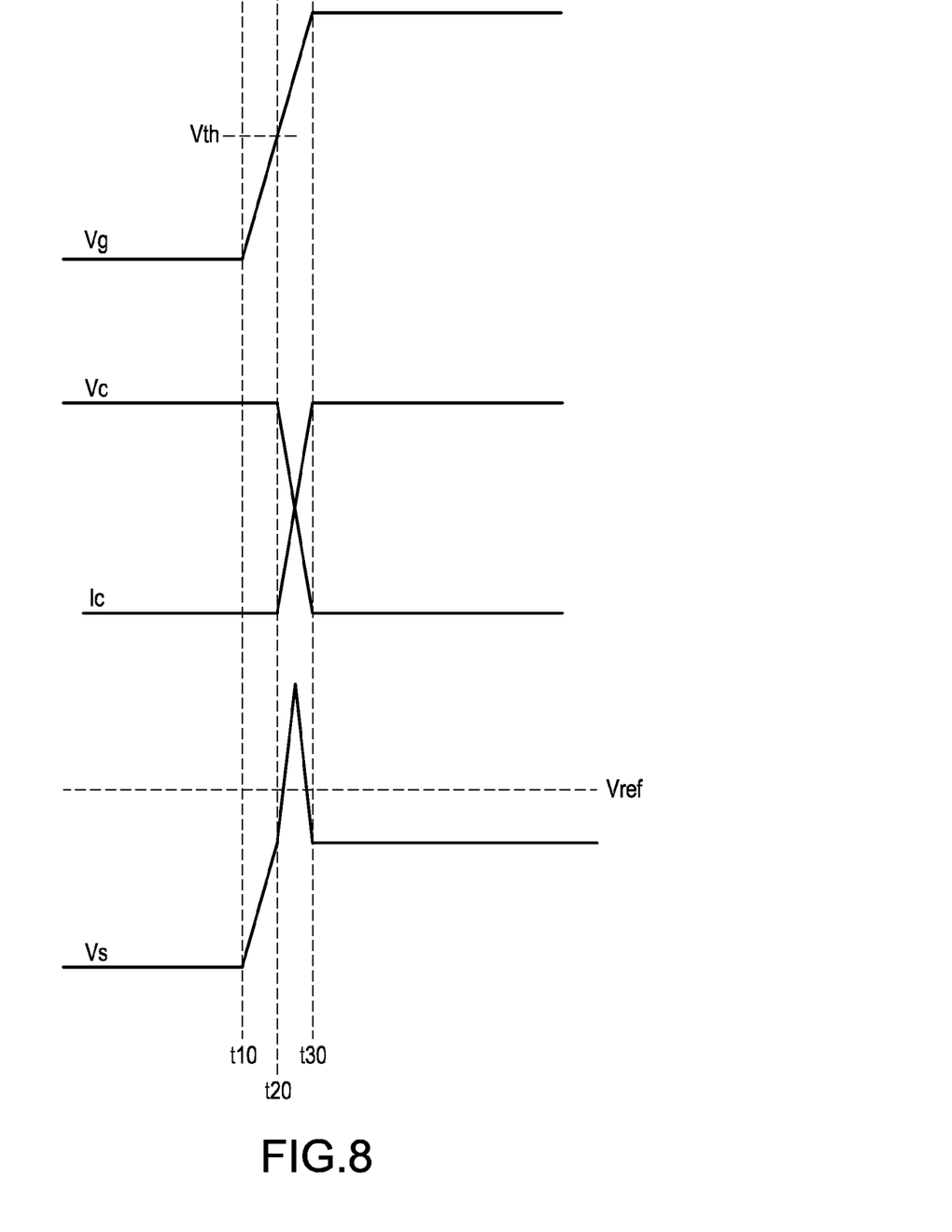
FIG. 8 is a diagram showing a timing chart for when the composite element 10 shown in FIG. 7 changes from an off-state to an on-state.
Figure 9:
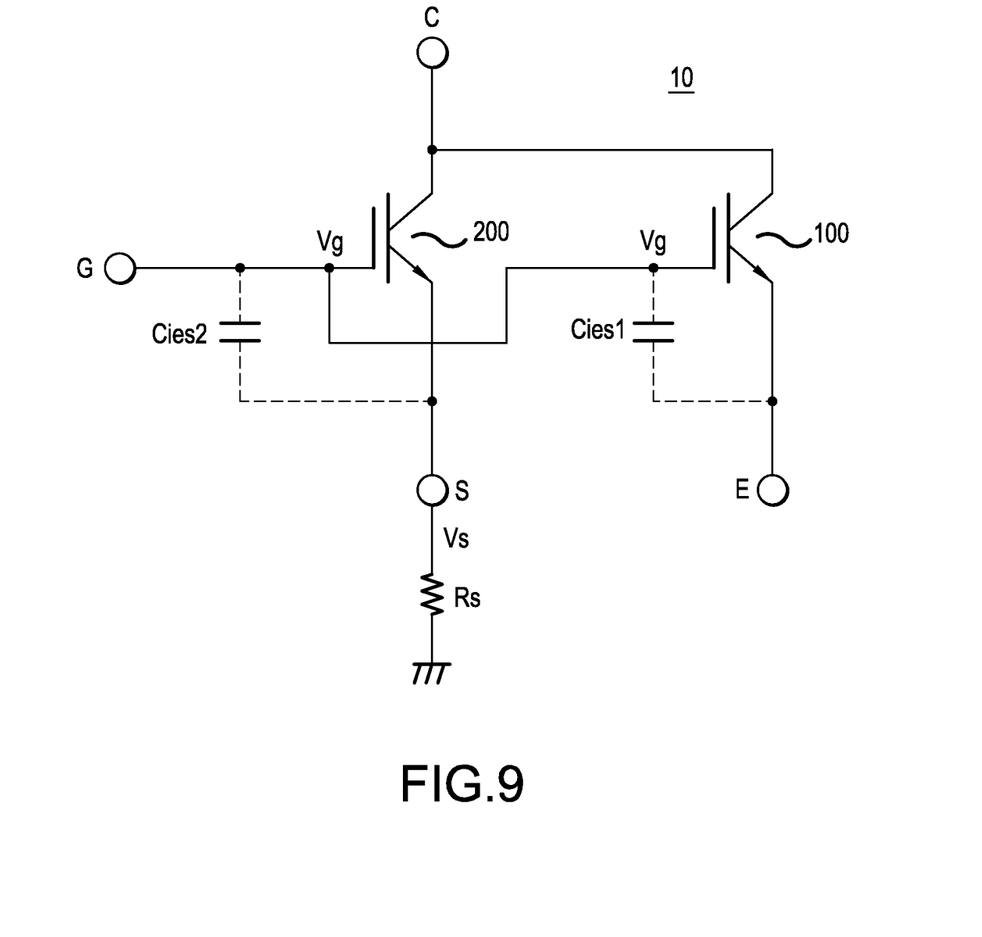
FIG. 9 is a diagram showing an equivalent circuit of the composite element 10.

A timing chart for when the composite element 10 shown in FIG. 7 changes from an off-state to an on-state is shown in FIG. 8. Also, an equivalent circuit of the composite element 10 for illustrating the operation shown in FIG. 8 is shown together with the resistor Rs in FIG. 9. In FIG. 9, Cies1 is an input capacitor of the main element 100 formed of a gate capacitor or the like, and Cies2 is an input capacitor of the sense element 200 formed of a gate capacitor or the like.

FIG. 8 shows, in order from the top, the gate voltage Vg of the composite element 10, collector current Ic and collector voltage Vc, and the sense voltage Vs. Vth in the drawing is the threshold voltage of the composite element 10.

In FIG. 8, the gate voltage Vg of the composite element 10 begins to rise at a time t10, and on the gate voltage Vg reaching the threshold voltage Vth of the composite element 10 at a time t20, the collector current Ic begins to flow, together with which the collector voltage Vc begins to decrease.

After the sense voltage Vs overshoots once, it becomes a steady value.

Basically, the collector current Ic and sense voltage Vs are in a correlative relationship (proportional relationship) but, the time of the gate voltage Vg rise being an exception, it is clear that the overshooting of the sense voltage Vs at the time of the gate voltage Vg rise is a phenomenon peculiar to the sense element 200 that has no connection with the collector current Ic.

As the overshooting of the sense voltage Vs has no connection with the collector current Ic, it is a cause of inhibition with regard to detection of the collector current Ic. The inventor has determined that the overshooting of the sense voltage Vs occurs due to a flow of current in response to variation in the voltage of the gate terminal G in the differential circuit formed of the input capacitor Cies2 and resistor Rs shown in FIG. 9. That is, the waveform of the sense voltage Vs is such that the overshoot caused by the differential circuit is superimposed on the original sense voltage proportional to the collector current Ic, because of which, even when the original sense voltage Vs (the last steady value of FIG. 8) is less than the reference voltage Vref that forms the reference for determining an overcurrent, as shown in FIG. 8, the sense voltage Vs exceeds the reference voltage Vref due to the amount of the overshoot being superimposed, and is erroneously determined to be an overcurrent. An actual product is such that it is difficult in terms of cost to provide the element with large excess power, because of which it is not unusual that the original sense voltage Vs is close to the reference voltage Vref.

False determination of the sense voltage Vs as an overcurrent due to an overshoot, even though it is not an overcurrent, is a problem, because of which means whereby overcurrent detection is prohibited for a certain time from the gate voltage beginning to rise has heretofore been adopted. Also, in See, for example, Japanese Patent Application Publication No. JP-A-7-240516, a sense voltage Vs overshoot causing mechanism differing from that of the invention is envisaged, attempting to prevent overshoot of the sense voltage Vs by causing conductivity of the sense element 200 in the composite element 10 to be later than conductivity of the main element 100. Each of these means has a problem in that an overcurrent cannot be detected without waiting a certain time (dead time), even though current has begun to flow through the main element 100. That is, immediate response is not possible even in the urgent situation of the load short circuiting, which includes the danger of leading to the serious accident of ignition. Also, with the method of Japanese Patent Application Publication No. JP-A-7-240516, it is not possible to prevent the phenomenon of overshoot caused by the differential circuit of the gate input portion from being superimposed on the original sense voltage, because of which the possibility of false detection remains.

SUMMARY OF THE INVENTION

An object of the invention is to provide a semiconductor device, and a current detector circuit that uses the semiconductor device, such that it is possible to resolve the heretofore described problems, prevent false detection relating to overcurrent, and determine with no dead time whether or not the current of the main element is an overcurrent.

Therefore, in order to resolve the heretofore described problems, the invention according to first aspect of the invention is characterized by having a main element and a sense element for detecting current flowing through the main element on the same semiconductor substrate, wherein a collector terminal of the main element and a collector terminal of the sense element are connected to each other, and when the main element is caused to be conductive, a gate signal indicating conductivity is applied to the gate of the sense element earlier than to the main element.

The invention according to a second aspect of the invention is characterized in that a gate signal to the main element when the main element is caused to be conductive is a gate signal provided to the sense element when the sense element is caused to be conductive, delayed by a delay circuit.

The invention according to a third aspect of the invention is characterized in that the main element and sense element are provided adjacent on the semiconductor substrate.

The invention according to a fourth aspect of the invention is characterized in that the main element and sense element are one power semiconductor element divided into two regions.

The invention according to a fifth aspect of the invention is characterized in that the main element and sense element are IGBTs (Insulated Gate Bipolar Transistors).

The invention according to a sixth aspect of the invention is characterized in that the main element is such that a plurality of basic elements are connected in parallel, and the sense element is formed of one unit element, or is such that a plurality of the unit elements are connected in parallel.

The invention according to a seventh aspect of the invention is characterized in being a current detector circuit wherein a signal indicating detection of the value of current flowing through the sense element is a current signal representing the current flowing through the main element.

The invention according to an eighth aspect of the invention is characterized in that the current signal is deactivated for a predetermined period from the gate signal causing the sense element to be conductive being provided to the sense element.

The invention according to a ninth aspect of the invention is characterized in that the predetermined period is at maximum the sum of the time from the gate signal causing the sense element to be conductive being provided to the sense element until the gate signal causing the main element to be conductive is provided to the main element and the time from the main element gate signal beginning to rise until reaching the threshold voltage of the main element.

The semiconductor device and current detector circuit of the invention are such that, by a gate signal indicating conductivity being applied to the gate of the sense element earlier than to the main element when the main element is caused to be conductive, and overshoot caused by the differential circuit of the sense element gate input portion being caused before current flows into the main element, it is possible to prevent false detection relating to overcurrent, and determine with no dead time whether or not the current of the main element is an overcurrent.

DETAILED DESCRIPTION

Hereafter, referring to the drawings, a detailed description will be given of an embodiment of the invention.

Example 1

Figure 1:
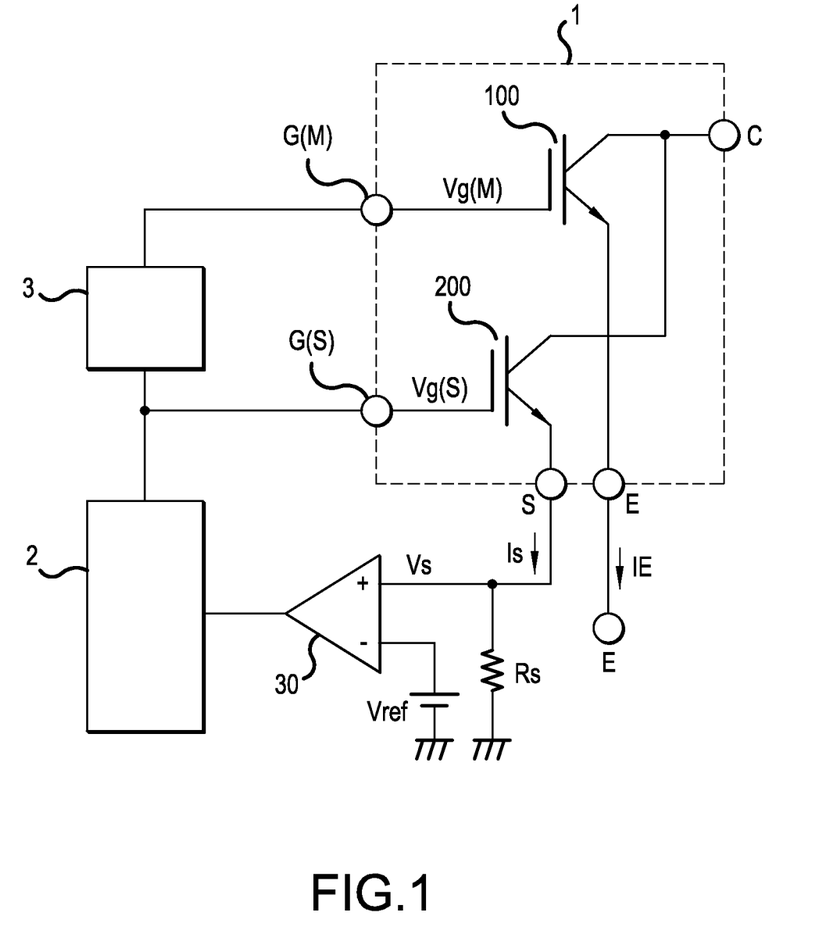
FIG. 1 is a circuit diagram for showing a configuration example of a semiconductor device and current detector circuit according to the invention.
Figure 2:
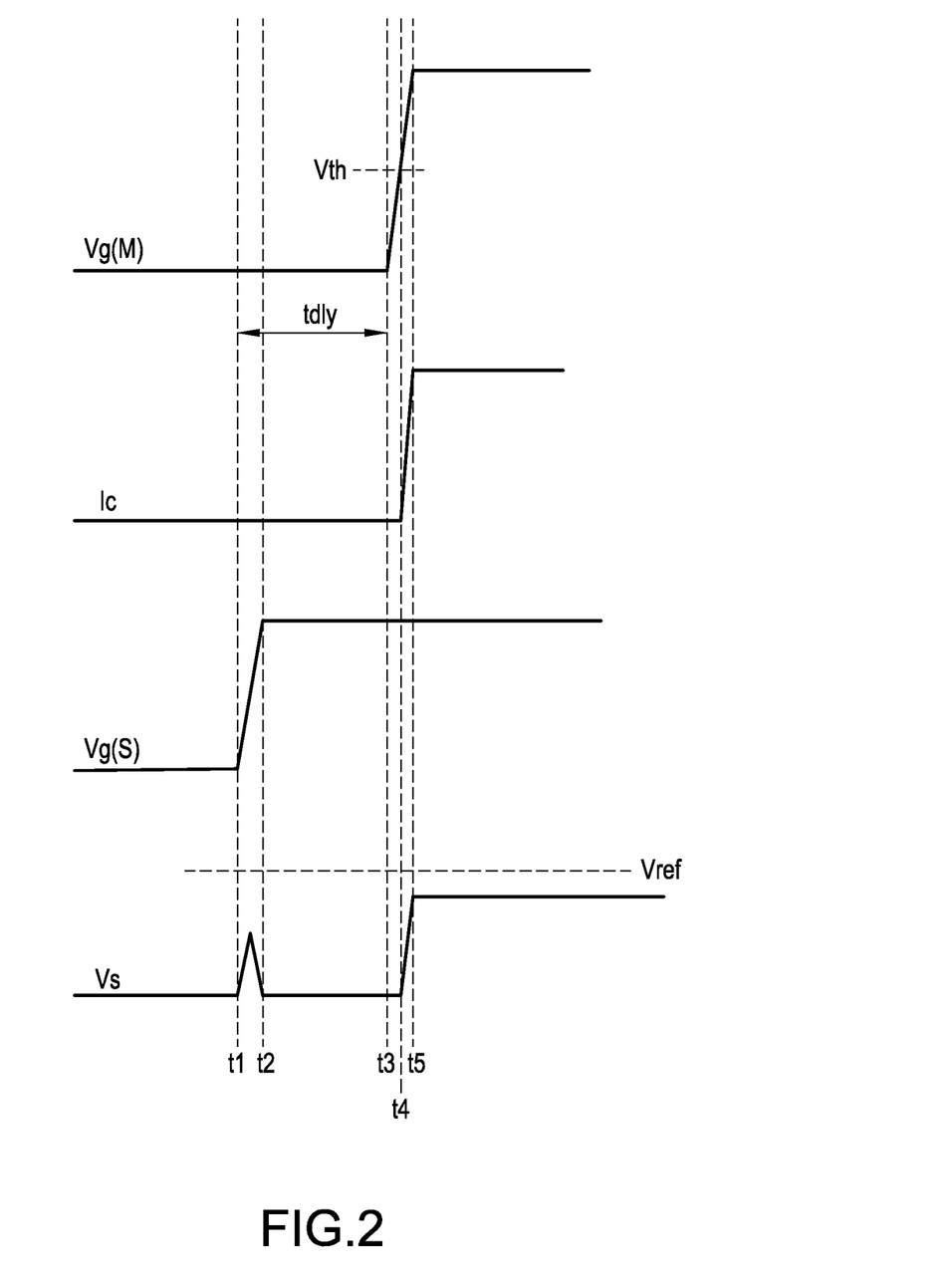
FIG. 2 is a timing chart for illustrating an operation of the circuit shown in FIG. 1.

FIG. 1 shows a configuration example of a semiconductor device and current detector circuit according to the invention. Also, FIG. 2 shows a timing chart thereof. The same reference signs are given to regions the same as in FIG. 7, and a detailed description will be omitted. Although the load 50, diode FWD, and power supply Vi of FIG. 7 are omitted from the drawing, they are assumed to be connected in the same way.

The circuit shown in FIG. 1 has a composite element 1, a control circuit 2, a delay circuit 3, the resistor Rs (the resistance value thereof is also taken to be Rs), the reference voltage Vref, and a comparator 30. The composite element 1 is configured of the main element 100 and sense element 200, in the same way as the composite element 10 shown in FIG. 5, but unlike the composite element 10, the main element 100 and sense element 200 are of configurations having independent gate terminals G(M) and G(S) respectively. Herein, the main element 100 and sense element 200 themselves are made in the same way as the existing elements of the background art.

The inventor, as a result of evaluating the composite element 1 wherein the main element 100 and sense element 200 each have independent gate terminals, has obtained the important finding that when the main element 100 and sense element 200 are in the vicinity of the same substrate, the operation of the sense element 200 is strongly affected by the operation of the main element 100, and even when the gate voltage of the sense element 200 exceeds the threshold voltage of the sense element 200, no collector current flows into the sense element 200 unless the main element 100 is conductive. In this case, it has also been confirmed that when a collector current flows into the main element 100 owing to a voltage the same as the gate voltage of the sense element 200 being applied to the gate of the main element 100, a collector current also flows into the sense element, and the composite element 1 performs an operation the same as that heretofore known as a composite element. The invention has been contrived based on these findings.

The delay circuit 3 generates a gate signal Vg(M), which is a delay of a gate signal Vg(S) input from the control circuit 2 into the gate terminal G(S) of the sense element 200, and inputs the gate signal Vg(M) into the gate terminal G(M) of the main element 100.

FIG. 2 shows a timing chart for when the composite element 1 of FIG. 1 is turned on. In FIG. 2, on the gate signal Vg(S) of the sense element 200 beginning to rise at a time t1, switching noise generated by a current responding to a rise of the voltage of the gate terminals G flowing through a differentiating circuit formed of an input capacitor Cies2 of the sense element 200 and the resistor Rs appears in a sense voltage Vs. As current is not yet flowing through the main element 100 at this time, there is no collector current flowing through the sense element 200, as heretofore described. Consequently, the original sense voltage Vs, which is proportional to the collector current Ic, is zero, and as it does not happen that any voltage that is not zero, which has sensed the collector current Ic, is superimposed on (added to) voltage generated by the switching noise, the sense voltage Vs at this time does not reach the reference voltage Vref. That is, it is possible to prevent a false detection of overcurrent due to switching noise.

The gate signal Vg(M) to the main element 100 begins to rise at a time t3, later by a delay time tdly than the gate signal Vg(S) of the sense element 200. Then, on the gate signal Vg(S) reaching a threshold voltage Vth of the main element 100 at a time t4, the main element 100 switches from an off state to an state, the collector current of the main element 100 and sense element 200 starts to flow, and the sense voltage Vs indicates a voltage proportional to the collector current Ic.

Provided that the delay time tdly is set so that the main element 100 switches from an off state to an on state after switching noise due to the rise in the gate voltage of the sense element 200 dies down, switching noise due to the rise in the gate voltage of the sense element 200 is not superimposed on the original sense voltage Vs, which is proportional to the collector current Ic, because of which it is possible to prevent a false detection of overcurrent. Furthermore, when it is envisaged that switching noise will become excessive because of the application, it is sufficient to deactivate overcurrent evaluation by the sense voltage Vs for a predetermined time from the time t1. Herein, it is sufficient that the predetermined time is, at maximum, (the delay time tdly+the time from the main element gate signal Vg(S) beginning to rise until reaching the threshold voltage Vth). Provided that this time can be secured, it is possible to prevent the effect of switching noise, and for dead time to be zero. When the time is longer, there is a possibility of dead time occurring.

Also, when the main element 100 switches from an off state to an on state, the sense element 200 gate voltage has already risen, because of which no dead time with respect to current detection occurs.

Example 2

Figure 3:
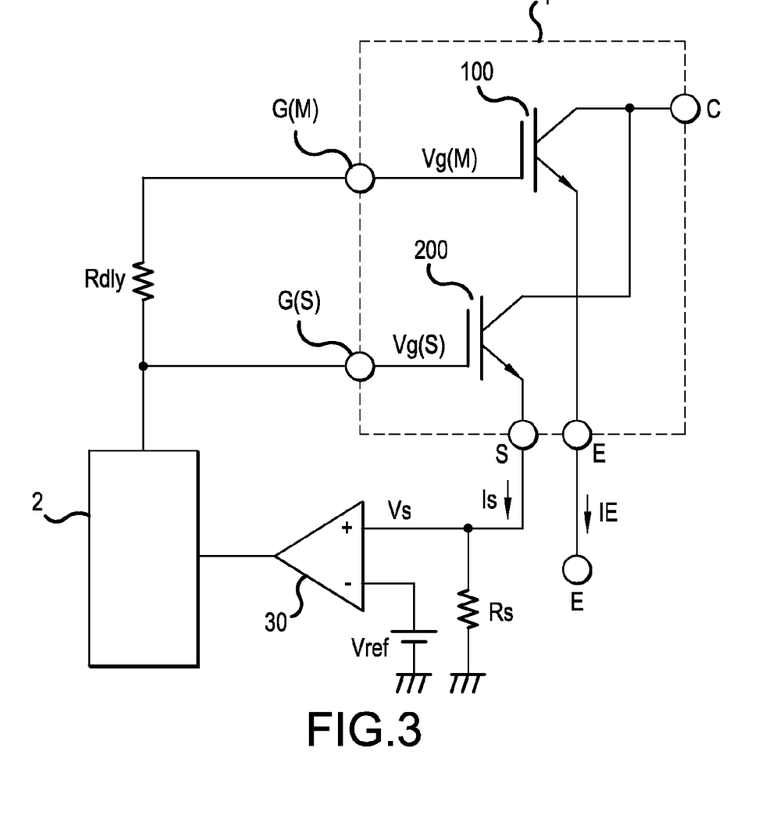
FIG. 3 is a circuit diagram for showing another configuration example of the semiconductor device and current detector circuit according to the invention.

FIG. 3 shows another configuration example of the semiconductor device and current detector circuit according to the invention. The configuration example is such that the delay circuit 3 of FIG. 1 is configured of a resistor Rdly. With this kind of simple configuration too, it is possible for the sense element 200 to be preceding and already realizing an on-state operation when the main element 100 switches from an off state to an on state. The timing chart at this time is practically the same as that shown in FIG. 2. Also, deactivating of overcurrent evaluation by the sense voltage Vs for a predetermined time from the time t1 can also be applied in the same way as Example 1.

What is claimed is:

1. A semiconductor device comprising:
    a main element;
    a sense element for detecting current flowing through the main element on the same semiconductor substrate;
    a collector terminal of the main element; and
    a collector terminal of the sense element,
    wherein the collector terminal of the main element and the collector terminal of the sense element are connected to each other, wherein, when the main element is caused to be conductive, a gate signal indicating conductivity is applied to the gate of the sense element earlier than to the main element, wherein no collector current flows into the sense element during a time when the main element is not conductive, and wherein a signal indicating detection of the value of current flowing through the sense element is a current signal representing the current flowing through the main element.

2. The semiconductor device according to claim 1, wherein a gate signal to the main element, when the main element is caused to be conductive, is a gate signal provided to the sense element when the sense element is caused to be conductive, delayed by a delay circuit.

3. The semiconductor device according to claim 1, wherein the main element and sense element are provided adjacent on the semiconductor substrate.

4. The semiconductor device according to claim 3, wherein the main element and sense element are one power semiconductor element divided into two regions.

5. The semiconductor device according to claim 1, wherein the main element and sense element are IGBTs (Insulated Gate Bipolar Transistors).

6. The semiconductor device according to claim 1, wherein the main element is such that a plurality of basic elements are connected in parallel, and the sense element is formed of one unit element.

7. A semiconductor device comprising:

a main element;

a sense element for detecting current flowing through the main element on the same semiconductor substrate;

a collector terminal of the main element; and a collector terminal of the sense element, wherein the collector terminal of the main element and the collector terminal of the sense element are connected to each other, wherein, when the main element is caused to be conductive, a gate signal indicating conductivity is applied to the gate of the sense element earlier than to the main element, wherein no collector current flows into the sense element during a time when the main element is not conductive, and wherein the predetermined period is at maximum the sum of the time from the gate signal causing the sense element to be conductive being provided to the sense element until the gate signal causing the main element to be conductive is provided to the main element and the time from the main element gate signal beginning to rise until reaching the threshold voltage of the main element.

* * * * *